(12) United States Patent
Cha (10) Patent No.: US 9,570,151 B1
(45) Date of Patent: Feb. 14, 2017

(54) SEMICONDUCTOR DEVICE AND SEMICONDUCTOR SYSTEM

(71) Applicant: SK hynix Inc., Icheon-si, Gyeonggi-do (KR)

(72) Inventor: Jin Youp Cha, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/193,912

(22) Filed: Jun. 27, 2016

(30) Foreign Application Priority Data

Apr. 1, 2016 (KR) .................. 10-2016-0039920

(51) Int. Cl.
| G11C 16/04 | (2006.01) |
| G11C 11/4093 | (2006.01) |
| G11C 11/4076 | (2006.01) |
| G11C 11/4091 | (2006.01) |
| G11C 11/4096 | (2006.01) |
| G11C 11/4094 | (2006.01) |

(52) U.S. Cl.
CPC ........ *G11C 11/4093* (2013.01); *G11C 11/4076* (2013.01); *G11C 11/4091* (2013.01); *G11C 11/4094* (2013.01); *G11C 11/4096* (2013.01)

(58) Field of Classification Search
CPC ............. G11C 11/4093; G11C 11/4076; G11C 11/4091; G11C 11/4094; G11C 11/4096
USPC ..................................................... 365/185.17
See application file for complete search history.

(56) References Cited

U.S. PATENT DOCUMENTS

| 5,999,458 A * | 12/1999 | Nishimura ........... G11C 7/1006 365/189.05 |
| 6,977,848 B2 * | 12/2005 | Choi ...................... G11C 7/103 365/189.05 |
| 6,982,924 B2 * | 1/2006 | Na ........................ G11C 7/1051 365/154 |
| 8,593,886 B2 * | 11/2013 | Lee ...................... G11C 7/1045 365/189.05 |
| 8,743,633 B2 * | 6/2014 | Aoki .............. G01B 31/318541 365/189.05 |
| 2009/0268534 A1 | 10/2009 | Kubouchi et al. |

FOREIGN PATENT DOCUMENTS

KR 1020110093435 A 8/2011

* cited by examiner

*Primary Examiner* — Pho M Luu
(74) *Attorney, Agent, or Firm* — William Park & Associates Ltd.

(57) ABSTRACT

A semiconductor device may include a data output circuit configured to sense and amplify data of an input/output line and a complementary input/output line based on the sense amplification control signal. The semiconductor device may include a data output control circuit configured to delay a point of time that the input/output line and the complementary input/output line are sensed and amplified.

20 Claims, 8 Drawing Sheets

SEMICONDUCTOR DEVICE AND SEMICONDUCTOR SYSTEM

CROSS-REFERENCES TO RELATED APPLICATIONS

The present application claims priority to Korean application number 10-2016-0039920, filed on Apr. 1, 2016, which is incorporated by reference in its entirety.

BACKGROUND

1. Technical Field

Embodiments of the present disclosure may generally relate to a semiconductor system including a semiconductor device, and more particularly, a semiconductor system including a semiconductor device configured for performing a test.

2. Related Art

In general, a data input/output line is used for data transmission in a semiconductor memory device. Data of a memory cell included in a memory core is transmitted to a bit line and sensed and amplified through a bit line sense amplifier. The data loaded in the bit line is transmitted to a global line via a local line. Typically, the global line is arranged across a plurality of banks, and serves to transmit data between a data pad and the memory core. At this time, a circuit is required for data transmission between the global line and the local line. In the case of DRAM, an input/output sense amplifier is used to sense and amplify data loaded in a local line and then transmit the amplified data to a global line during a read operation. In a DRAM, a write driver is used to transmit data loaded in the global line to the local line during a write operation.

With the development of technology, semiconductor devices have been gradually reduced in size, and the space between input/output lines also has been gradually narrowed. As the space between input/output lines is reduced, a bridge may be formed between input/output lines, thereby causing a defect in the semiconductor device. The bridge may be formed when parasitic ions of the input/output lines form a current path between the input/output lines. When the bridge is formed between the input/output lines, data loaded in the input/output lines may be lost due to a leakage current caused by the bridge.

SUMMARY

In an embodiment, a semiconductor device may be provided. The semiconductor device may include a data output control circuit configured to generate a sense amplification control signal by delaying a column select signal by a first delay section based on a control code signal. The semiconductor device may include a data output circuit configured to sense and amplify data of an input/output line and a complementary input/output line based on the sense amplification control signal, and output the amplified data as an output data signal. The column select signal may be enabled to transfer data loaded in a bit line and a complementary bit line to the input/output line and the complementary input/output line.

In an embodiment, a semiconductor system may be provided. The semiconductor system may include a first semiconductor device configured to output a command signal and a control code signal, and receive an output data signal. The semiconductor system may include a second semiconductor device configured to generate a sense amplification control signal by delaying a column select signal by a first delay section based on the command signal and the control code signal, the column select signal may be generated based on performing a test read operation, sense and amplify a signal of an input/output line and a complementary input/output line based on the sense amplification control signal, and output the amplified signal as the output data signal. The column select signal may be enabled to transfer data loaded in a bit line and a complementary bit line to the input/output line and the complementary input/output line.

DETAILED DESCRIPTION

Embodiments will hereinafter be described with reference to the accompanying drawings. It should be noted that the drawings are not to precise scale and may be exaggerated in thickness of lines or sizes of components for descriptive convenience and clarity only. Furthermore, the terms as used herein are defined by taking functions into account and can be changed according to the custom or intention of users or operators. Therefore, definition of the terms should be made according to the overall disclosures set forth herein.

Embodiments may be directed to a semiconductor system including a semiconductor device capable of testing a bridge which is formed between an input/output line and a complementary input/output line.

Figure 1:
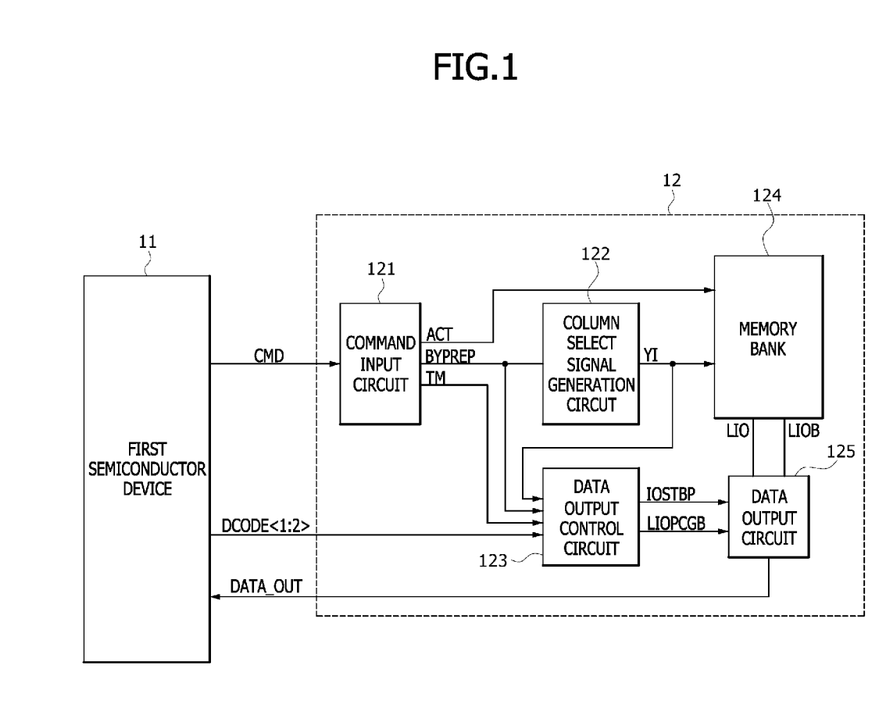
FIG. 1 is a block diagram illustrating a representation of an example of the configuration of a semiconductor system in accordance with an embodiment.

Referring to FIG. 1, a semiconductor system in accordance with an embodiment may include first and second semiconductor devices 11 and 12.

The first semiconductor device 11 may output a command signal CMD and a control code signal DCODE<1:2>, and receive an output data signal DATA_OUT. The command signal CMD may include a plurality of bits and thus have a variety of logic level combinations. The first semiconductor device 11 may output the command signal CMD having a preset logic level combination for controlling the operation of the semiconductor device 12. The first semiconductor device 11 may control a test operation, active operation, write operation and refresh operation of the semiconductor device 12, according to the logic level combination of the command signal CMD. The first semiconductor device 11 may output the control code signal DCODE<1:2> in a test mode for testing whether a bridge was formed between an input/output line LIO and a complementary input/output line LIOB which are included in the semiconductor device 12. The control code signal DCODE<1:2> may set a delay section for delaying a column select signal YI in order to generate a sense amplification control signal IOSTBP according to a logic level combination. The first semiconductor device 11 may receive an output data signal DATA_OUT in the test mode, and determine whether a bridge was formed between the input/output line LIO and the complementary input/output line LIOB.

The second semiconductor device 12 may include a command input circuit 121, a column select signal generation circuit 122, a data output control circuit 123, a memory bank 124 and a data output circuit 125.

The command input circuit 121 may receive the command signal CMD, and generate an active signal ACT, a read pulse signal BYPREP and a test signal TM. The command input circuit 121 may decode the command signal CMD, and generate the active signal ACT, the read pulse signal BYPREP or the test signal TM which is enabled according to an operation mode. The active signal ACT may be enabled during an active operation for activating a word line (not illustrated) included in the memory bank 124. The active signal ACT may be enabled before a read operation or write operation is performed. The read pulse signal BYPREP may include pulses which are generated during a read operation for reading data included in the memory bank 124. The test signal TM may be enabled in the test mode for testing a bridge which is formed between the input/output line LIO and the complementary input/output line LIOB.

The column select signal generation circuit 122 may generate the column select signal YI by delaying the read pulse signal BYPREP. The column select signal generation circuit 122 may set a delay section such that the column select signal YI is generated after data are loaded in a bit line BL and a complementary bit line BLB of FIG. 3. The column select signal YI may be used to transfer data loaded in the bit line BL and the complementary bit line BLB to the input/output line LIO and the complementary input/output line LIOB, the bit line BL and the complementary bit line BLB being included in the memory bank 124.

The data output control circuit 123 may receive the column select signal YI, the read pulse signal BYPREP, the test signal TM and the control code signal DCODE<1:2>, and generate the sense amplification control signal IOSTBP and a precharge control signal LIOPCGB. The data output control circuit 123 may generate the sense amplification control signal IOSTBP by delaying the column select signal YI in response to the test signal TM and the control code signal DCODE<1:2>. The data output control circuit 123 may generate the precharge control signal LIOPCGB in response to the read pulse signal BYPREP, the test signal TM and the sense amplification control signal IOSTBP. When the test signal TM is disabled to perform a normal read operation, the data output control circuit 123 may generate the sense amplification control signal IOSTBP by delaying the column select signal YI by a first delay section. The first delay section may be set in such a manner that the sense amplification control signal IOSTBP is enabled after data are loaded into the input/output line LIO and the complementary input/output line LIOB by the column select signal YI. When a normal read operation is performed, the data output control circuit 123 may generate the precharge control signal LIOPCGB which is disabled in synchronization with a point of time that the read pulse signal BYPERP is enabled, and enabled after a preset section. When the normal read operation is performed, the precharge control signal LIOPCGB may be enabled after a point of time that the sense amplification control signal IOSTBP is enabled. When the test signal TM is enabled to perform a test read operation, the data output control circuit 123 may generate the sense amplification control signal IOSTBP by delaying the column select signal YI by a second delay section in response to the control code signal DCODE<1:2>. The second delay section may be set according to the logic level combination of the control code signal DCODE<1:2>. The second delay section may be set to a larger section than a section in which data are loaded into the input/output line LIO and the complementary input/output line LIOB and the levels of the input/output line LIO and the complementary input/output line LIOB are equalized by a bridge. Depending on embodiments, a bridge formed between the input/output line LIO and the complementary input/output line LIOB may be tested while the second delay section is changed in stages. When a test read operation is performed, the data output control circuit 123 may generate the precharge control signal LIOPCGB which is disabled in synchronization with a point of time that the read pulse signal BYPERP is enabled, and enabled in synchronization with the sense amplification control signal IOSTBP.

The memory bank 124 may transfer data stored in a memory cell to the input/output line LIO and the complementary input/output line LIOB in response to the active signal ACT and the column select signal YI. The memory bank 124 may transfer data stored in a memory cell to the bit line BL and the complementary bit line BLB of FIG. 3 in response to the active signal ACT. The memory bank 124 may transfer the data of the bit line BL and the complementary bit line BLB to the input/output line LIO and the complementary input/output line LIOB in response to the column select signal YI.

The data output circuit 125 may sense and amplify the input/output line LIO and the complementary input/output line LIOB in response to the sense amplification control signal IOSTBP, and output an output data signal DATA_OUT. When the sense amplification control signal IOSTBP is enabled, the data output circuit 125 may sense and amplify a potential difference between the input/output line LIO and the complementary input/output line LIOB, and output the amplified potential difference as the output data signal DATA_OUT. The data output circuit 125 may precharge the input/output line LIO and the complementary input/output line LIOB to a preset level in response to the precharge control signal LIOPCGB.

Figure 2:
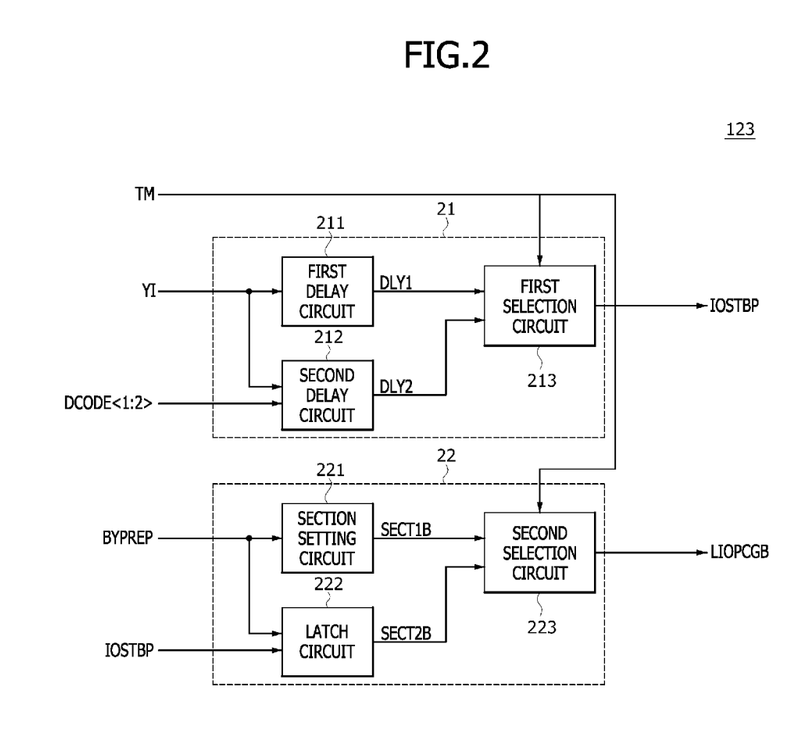
FIG. 2 is a block diagram illustrating a representation of an example of a data output control circuit included in the semiconductor system illustrated in FIG. 1.

Referring to FIG. 2, the data output control circuit 123 may include a sense amplification control circuit 21 and a precharge control circuit 22.

The sense amplification control circuit 21 may include a first delay circuit 211, a second delay circuit 212 and a first selection circuit 213.

The first delay circuit 211 may generate a first delayed signal DLY1 by delaying the column select signal YI by the first delay section. The first delay section may be set to enable the sense amplification control signal IOSTBP after data are loaded into the input/output line LIO and the complementary input/output line LIOB by the column select signal YI during a normal read operation.

The second delay circuit 212 may generate a second delayed signal DLY2 by delaying the column select signal YI by the second delay section in response to the control code signal DCODE<1:2>. The second delay circuit 212 may control a point of time that the second delayed signal DLY2 is enabled, according to the control code signal DCODE<1:2> which is inputted during a test read operation. For example, when the control code signal DCODE<1:2> includes two bits having a logic level combination of "L, L", the second delay circuit 212 may generate the second delayed signal DLY2 by delaying the column select signal YI by a third delay section. When the first and second control code signals DCODE<1:2> have a logic level combination of "L, L", it may indicate that the first control code signal DCODE<1> has a logic low level "L" and the second control code signal DCODE<2> has a logic low level "L". When the first and second control code signals DCODE<1:2> have a logic level combination of "L, H", the second delay circuit 212 may generate the second delayed signal DLY2 by delaying the column select signal YI by a fourth delay section. When the first and second control code signals DCODE<1:2> have a logic level combination of "L, H", it may indicate that the first control code signal DCODE<1> has a logic high level "H" and the second control code signal DCODE<2> has a logic low level "L". When the first and second control code signals DCODE<1:2> have a logic level combination of "H, L", the second delay circuit 212 may generate the second delayed signal DLY2 by delaying the column select signal YI by a fifth delay section. When the first and second control code signals DCODE<1:2> have a logic level combination of "H, L", it may indicate that the first control code signal DCODE<1> has a logic low level "L" and the second control code signal DCODE<2> has a logic high level "H". When the first and second control code signals DCODE<1:2> have a logic level combination of "H, H", the second delay circuit 212 may generate the second delayed signal DLY2 by delaying the column select signal YI by a sixth delay section. When the first and second control code signals DCODE<1:2> have a logic level combination of "H, H", it may indicate that the first control code signal DCODE<1> has a logic high level "H" and the second control code signal DCODE<2> has a logic high level "H". The third delay section may be set to have a delay time less than the fourth delay section, the fourth delay section may be set to have a delay time less than the fifth delay section, and the fifth delay section may be set to have a delay time less than the sixth delay section. Depending on embodiments, the third to sixth delay sections may be set to various values.

The first selection circuit 213 may output the first or second delayed signal DLY1 or DLY2 as the sense amplification control signal IOSTBP in response to the test signal TM. The first selection circuit 213 may output the first delayed signal DLY1 as the sense amplification control signal IOSTBP when the test signal TM is disabled. The first selection circuit 213 may output the second delayed signal DLY2 as the sense amplification control signal IOSTBP when the test signal TM is enabled.

The precharge control circuit 22 may include a section setting circuit 221, a latch circuit 222, and a second selection circuit 223.

The section setting circuit 221 may generate a first section signal SECT1B which is disabled during a preset section in response to the read pulse signal BYPREP. The section setting circuit 221 may generate the first section signal SECT1B which is disabled to a logic high level in synchronization with the read pulse signal BYPREP, and enabled to a logic low level after the preset section. The preset section may be set to a section from the point of time that the read pulse signal BYPERP is enabled to the point of time that the sense amplification control signal IOSTBP is enabled, during a normal read operation.

The latch circuit 222 may generate a second section signal SECT2B in response to the read pulse signal BYPREP and the sense amplification control signal IOSTBP. The latch circuit 222 may generate the second section signal SECT2B which is disabled to a logic high level in response to the read pulse signal BYPREP and enabled to a logic low level in response to the sense amplification control signal IOSTBP.

The second selection circuit 223 may output the first or second section signal SECT1B or SECT2B as the precharge control signal LIOPCGB in response to the test signal TM. The second selection circuit 223 may output the first section signal SECT1B as the precharge control signal LIOPCGB when the test signal TM is disabled. The second selection circuit 223 may output the second section signal SECT2B as the precharge control signal LIOPCGB when the test signal TM is enabled.

Figure 3:
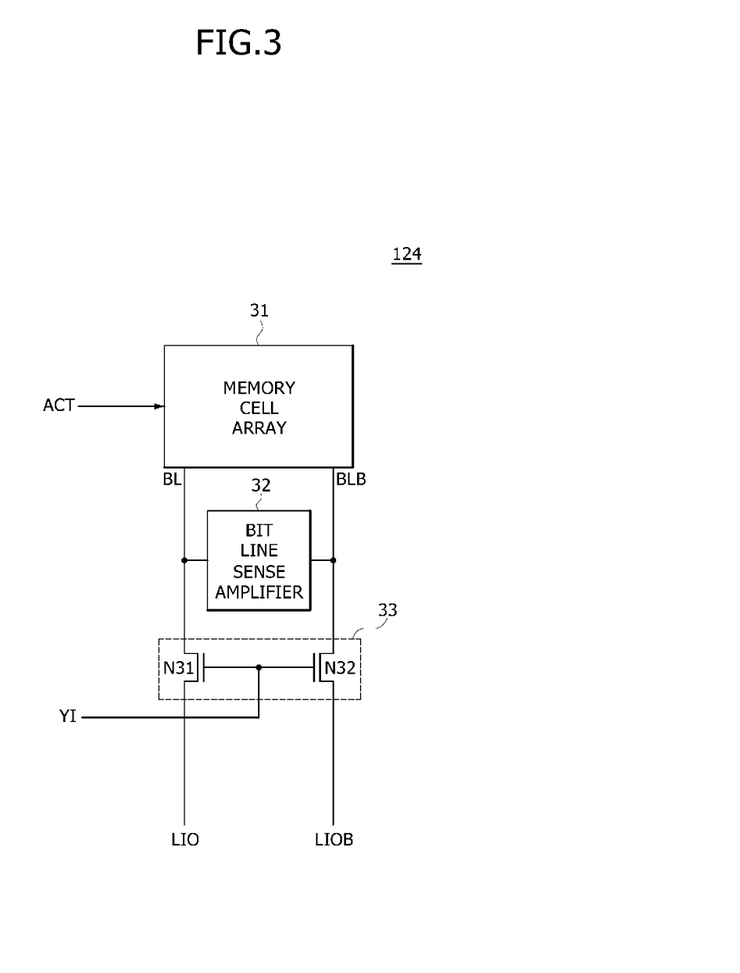
FIG. 3 is a diagram illustrating a representation of an example of a memory bank included in the semiconductor system illustrated in FIG. 1.

Referring to FIG. 3, the memory bank 124 may include a memory cell array 31, a bit line sense amplifier 32 and a coupling circuit 33.

The memory cell array 31 may transfer data of a memory cell included therein to the bit line BL and the complementary bit line BLB in response to the active signal ACT. The memory cell array 31 may transfer data of a memory cell corresponding to an address (not illustrated) inputted from outside to the bit line BL and the complementary bit line BLB.

The bit line sense amplifier 32 may sense and amplify the bit line BL and the complementary bit line BLB. When data are loaded into the bit line BL and the complementary bit line BLB such that a potential difference occurs between the bit line BL and the complementary bit line BLB, the bit line sense amplifier 32 may sense and amplify the bit line BL and the complementary bit line BLB.

The coupling circuit 33 may include NMOS transistors N31 and N32. The NMOS transistor N31 may transfer data loaded in the bit line BL to the input/output line LIO in response to the column select signal YI. The NMOS transistor N32 may transfer data loaded in the complementary bit line BLB to the complementary input/output line LIOB in response to the column select signal YI.

Referring to FIGS. 4 to 7, the examples of operations of a semiconductor system in accordance with an embodiment will be described as follows.

Figure 4:
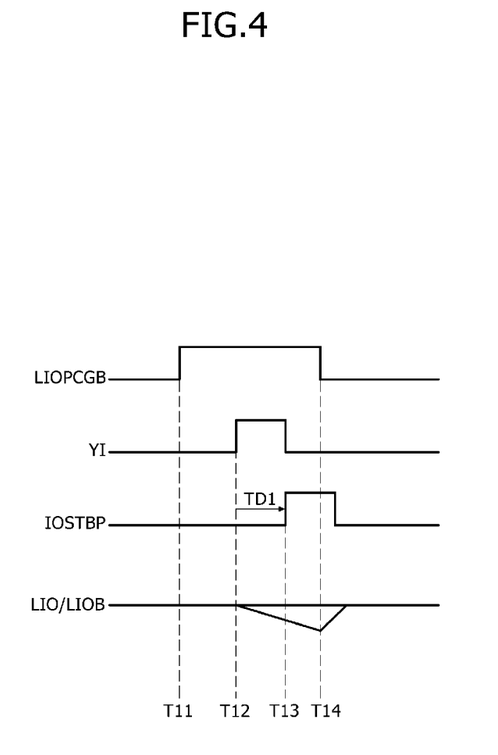
FIGS. 4 to 7 are timing diagrams for describing examples of the operations of a semiconductor system illustrated in FIG. 1.

FIG. 4 is a timing diagram illustrating a representation of an example of a normal read operation in accordance with an embodiment.

Before a time point T11, the input/output line LIO and the complementary input/output line LIOB may be driven to a preset level in response to the precharge control signal LIOPCGB enabled to a logic low level. At the time point T11, the precharge control signal LIOPCGB may be disabled to a logic high level in response to the read pulse signal BYPREP. The input/output line LIO and the complementary input/output line LIOB may be retained at the preset level at the time point T11. The column select signal generation circuit 122 may delay the read pulse signal BYPREP and generate the column select signal YI which is enabled to a logic high level at a time point T12. When the column select signal YI is enabled at the time point T12, the input/output line LIO and the complementary input/output line LIOB may receive data from the bit line BL and the complementary bit line BLB, and form a potential difference. The data output control circuit 123 may delay the column select signal YI by a first delay section TD1, and generate the sense amplification control signal IOSTBP which is enabled to a logic high level at a time point T13. The data output circuit 125 may sense and amplify the potential difference between the input/output line LIO and the complementary input/output line LIOB in response to the sense amplification control signal IOSTBP at the time point T13, and output the amplified potential difference as the output data signal DATA_OUT. The precharge control signal LIOPCGB may be enabled to a logic low level at a time point T14 after the time point T13 that the sense amplification control signal IOSTBP is enabled. The input/output line LIO and the complementary input/output line LIOB may be precharged to the preset level in response to the precharge control signal LIOPCGB which is enabled at the time point T14.

Figure 5:
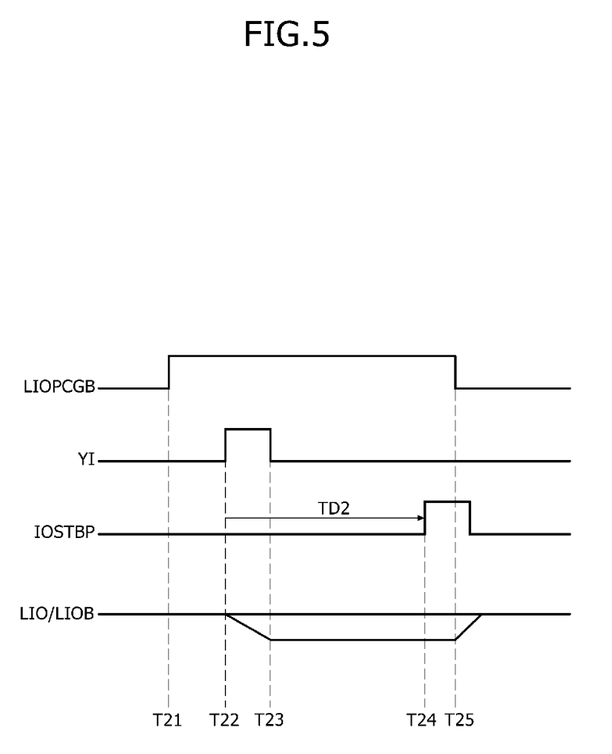

FIG. 5 is a timing diagram illustrating an example in which no bridge is formed between the input/output line LIO and the complementary input/output line LIOB during a test read operation in accordance with an embodiment.

Before a time point T21, the input/output line LIO and the complementary input/output line LIOB may be driven to a preset level in response to the precharge control signal LIOPCGB enabled to a logic low level. At the time point T21, the precharge control signal LIOPCGB may be disabled to a logic high level in response to the read pulse signal BYPREP. The input/output line LIO and the complementary input/output line LIOB may be retained at the preset level at the time point T21. The column select signal generation circuit 122 may delay the read pulse signal BYPREP and generate the column select signal YI which is enabled to a logic high level from the time point T22 to a time point T23. During the section from the time point T22 to the time point T23 in which the column select signal YI is enabled, the input/output line LIO and the complementary input/output line LIOB may receive data from the bit line BL and the complementary bit line BLB, and form a potential difference therebetween. Then, since no bridge is formed between the input/output line LIO and the complementary input/output line LIOB, the potential difference may be retained even after the time point T23. The data output control circuit 123 may delay the column select signal YI by a second delay section TD2 larger than the first delay section TD1, and generate the sense amplification control signal IOSTBP which is enabled to a logic high level at a time point T24. The second delay section TD2 may be set according to a logic level combination of the control code signal DCODE<1:2>. The data output circuit 125 may sense and amplify the potential difference between the input/output line LIO and the complementary input/output line LIOB in response to the sense amplification control signal IOSTBP at the time point T24, and output the amplified potential difference as the output data signal DATA_OUT. The precharge control signal LIOPCGB may be enabled to a logic low level at a time point T25 after the time point T24 that the sense amplification control signal IOSTBP is enabled. The input/output line LIO and the complementary input/output line LIOB may be precharged to the preset level in response to the precharge control signal LIOPCGB which is enabled at the time point T25.

Figure 6:
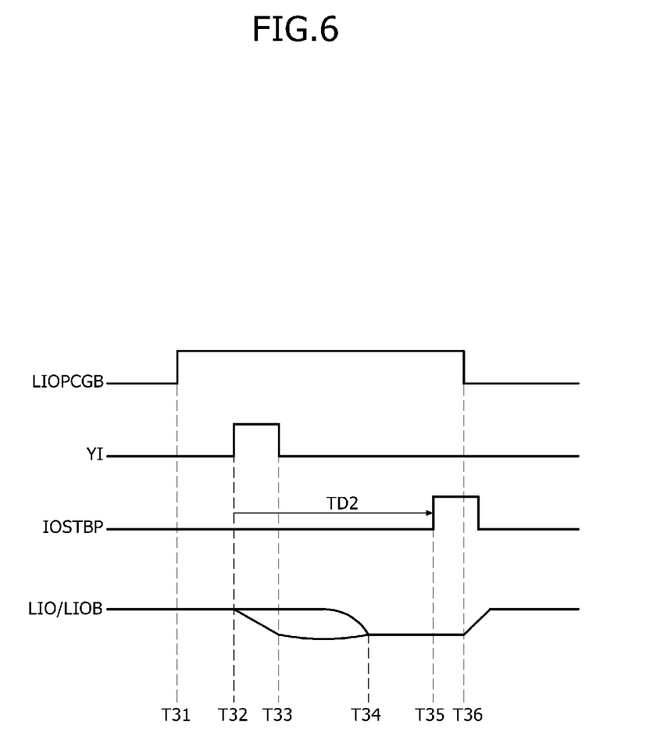

FIG. 6 is a timing diagram illustrating an example in which a bridge is formed between the input/output line LIO and the complementary input/output line LIOB during a test read operation in accordance with an embodiment.

Before a time point T31, the input/output line LIO and the complementary input/output line LIOB may be driven to a preset level in response to the precharge control signal LIOPCGB enabled to a logic low level. At the time point T31, the precharge control signal LIOPCGB may be disabled to a logic high level in response to the read pulse signal BYPREP. The input/output line LIO and the complementary input/output line LIOB may be retained at the preset level at the time point T31. The column select signal generation circuit 122 may delay the read pulse signal BYPREP and generate the column select signal YI which is enabled to a logic high level from a time point T32 to a time point T33. During the section from the time point T32 to the time point T33 in which the column select signal YI is enabled, the input/output line LIO and the complementary input/output line LIOB may receive data from the bit line BL and the complementary bit line BLB, and form a potential difference therebetween. As a bridge is formed between the input/output line LIO and the complementary input/output line LIOB, the levels of the input/output line LIO and the complementary input/output line LIOB may be equalized to each other at a time point T34. The data output control circuit 123 may delay the column select signal YI by a second delay section TD2 larger than the first delay section TD1, and generate the sense amplification control signal IOSTBP which is enabled to a logic high level at a time point T35. The second delay section TD2 may be set according to a logic level combination of the control code signal DCODE<1:2>. At this time, since the input/output line LIO and the complementary input/output line LIOB have the same level at the time point T35 that the sense amplifier enable signal IOSTBP is enabled, the input/output line LIO and the complementary input/output line LIOB cannot be sensed and amplified. Thus, the data output circuit 125 may output a wrong output data signal DATA_OUT. The precharge control signal LIOPCGB may be enabled to a logic low level at a time point T36 after the time point T35 that the sense amplification control signal IOSTBP is enabled, and precharge the input/output line LIO and the complementary input/output line LIOB to the preset level. Thus, the first semiconductor device 11 may receive the wrong data signal DATA_OUT, and thus determine whether a bridge was formed between the input/output line LIO and the complementary input/output line LIOB.

Figure 7:
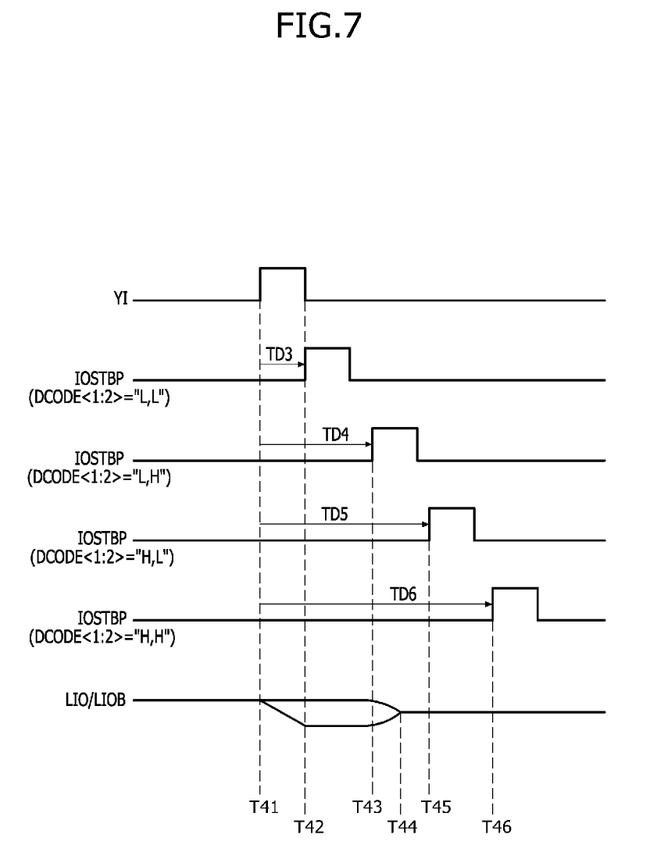

FIG. 7 is a timing diagram illustrating an example of a test operation which is performed while the enable time point of the precharge control signal IOSTBP is controlled in stages, when a bridge is formed between the input/output line LIO and the complementary input/output line LIOB during a test read operation in accordance with an embodiment.

The column select signal generation circuit 122 may delay the read pulse signal BYPREP and generate the column select signal YI which is enabled to a logic high level at a time point T41. At the time point T41 that the column select signal YI is enabled, the input/output line LIO and the complementary input/output line LIOB may receive data from the bit line BL and the complementary bit line BLB, and form a potential difference therebetween. As a bridge is formed between the input/output line LIO and the complementary input/output line LIOB, the levels of the input/output line LIO and the complementary input/output line LIOB may be equalized to each other at a time point T44.

In the case of a first test read operation in which the control code signal DCODE<1:2> is outputted as "L, L", the data output control circuit 123 may delay the column select signal YI by the third delay section TD3, and generate the sense amplification control signal IOSTBP which is enabled to a logic high level at a time point T42. When the control code signal DCODE<1:2> has a logic level combination of "L, L', it may indicate that the first semiconductor device 11 outputs the first control code signal DCODE<1> at a logic low level and outputs the second control code signal DCODE<2> at a logic low level. At the time point T42 that the sense amplification control signal IOSTBP is enabled, the input/output line LIO and the complementary input/output line LIOB may retain a potential difference therebetween. Thus, the data output circuit 125 may sense and amplifier the input/output line LIO and the complementary output line LIOB, and output a normal output data signal DATA_OUT.

In the case of a second test read operation in which the control code signal DCODE<1:2> is outputted as "L, H", the data output control circuit 123 may delay the column select signal YI by the fourth delay section TD4, and generate the sense amplification control signal IOSTBP which is enabled to a logic high level at a time point T43. When the control code signal DCODE<1:2> has a logic level combination of "L, H", it may indicate that the first semiconductor device 11 outputs the first control code signal DCODE<1> at a logic high level and outputs the second control code signal DCODE<2> at a logic low level. At the time point T43 that the sense amplification control signal IOSTBP is enabled, the input/output line LIO and the complementary input/output line LIOB may retain a potential difference therebetween. Thus, the data output circuit 125 may sense and amplifier the input/output line LIO and the complementary output line LIOB, and output a normal output data signal DATA_OUT.

In the case of a third test read operation in which the first semiconductor device outputs the control code signal DCODE<1:2> as "H, L", the data output control circuit 123 may delay the column select signal YI by the fifth delay section TD5, and generate the sense amplification control signal IOSTBP which is enabled to a logic high level at a time point T45. When the control code signal DCODE<1:2> has a logic level combination of "H, L", it may indicate that the first semiconductor device 11 outputs the first control code signal DCODE<1> at a logic low level and outputs the second control code signal DCODE<2> at a logic high level. At this time, since the input/output line LIO and the complementary input/output line LIOB have the same level at the time point T45 that the amplification control signal IOSTBP is enabled, the input/output line LIO and the complementary input/output line LIOB cannot be sensed and amplified. Thus, the data output circuit 125 may output a wrong output data signal DATA_OUT.

In the case of a fourth test read operation in which the first semiconductor device outputs the control code signal DCODE<1:2> as "H, H", the data output control circuit 123 may delay the column select signal YI by the sixth delay section TD6, and generate the sense amplification control signal IOSTBP which is enabled to a logic high level at a time point T46. When the control code signal DCODE<1:2> has a logic level combination of "H, H", it may indicate that the first semiconductor device 11 outputs the first control code signal DCODE<1> at a logic high level and outputs the second control code signal DCODE<2> at a logic high level. At this time, since the input/output line LIO and the complementary input/output line LIOB have the same level at the time point T46 that the sense amplification control signal IOSTBP is enabled, the input/output line LIO and the complementary input/output line LIOB cannot be sensed and amplified. Thus, the data output circuit 125 may output a wrong output data signal DATA_OUT.

Therefore, the first semiconductor device 11 may receive a wrong output data signal DATA_OUT during the third and fourth test read operations, and determine whether a bridge was formed between the input/output line LIO and the complementary input/output line LIOB. Furthermore, the first semiconductor device 11 may determine that the levels of the input/output line LIO and the complementary output line LIOB are equalized to each other by a bridge between the time point T43 that the sense amplification control signal IOSTBP is enabled during the second test read operation and the time point T45 that the sense amplification control signal IOSTBP is enabled during the third test read operation.

As described above, the semiconductor system in accordance with an embodiment may control the enable time point of the sense amplification control signal IOSTBP during the test read operation. The data output control circuit 123 may output the output data signal DATA_OUT by enabling the sense amplification control signal IOSTBP after the time point T34 that the levels of the input/output line LIO and the complementary input/output line LIOB are equalized by a bridge, during the test read operation. The first semiconductor device 11 may check the output data signal DATA_OUT, and test a bridge which is formed between the input/output line LIO and the complementary input/output line LIOB. The semiconductor system in accordance with an embodiment may perform the first to fourth test operations in which the enable time point of the sense amplification control signal IOSTBP is changed in stages, and check a point of time that the levels of the input/output line LIO and the complementary input/output line LIOB are equalized to each other by a bridge.

The semiconductor devices and the semiconductor systems which have been described with reference to FIGS. 1 to 7 may be applied to electronic systems including, for example but not limited to, a memory system, a graphic system, a computing system and a mobile system. For example, referring to FIG. 8, an electronic system 1000 in accordance with an embodiment may include a data storage 1001, a memory controller 1002, a buffer memory 1003 and an input/output interface 1004.

Figure 8:
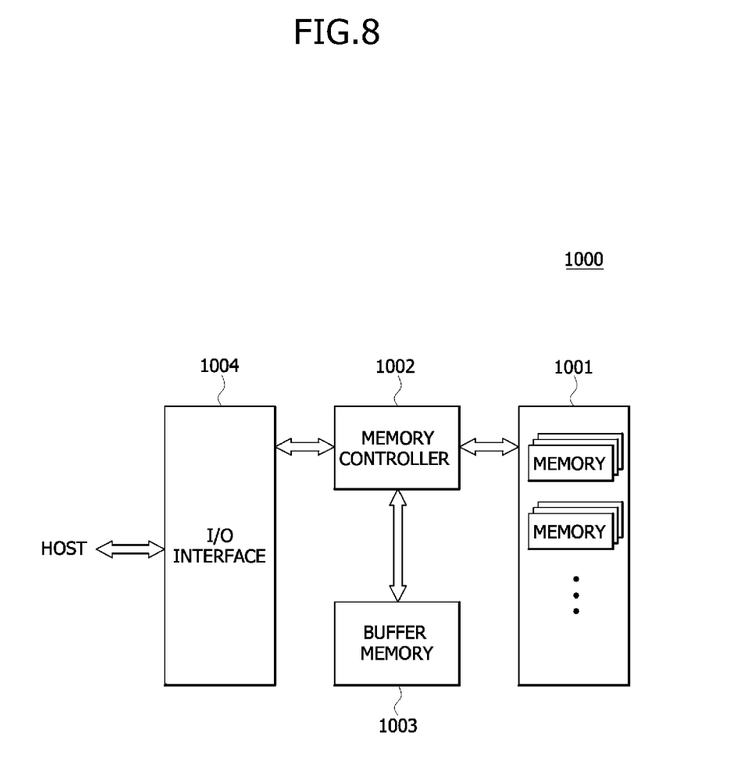
FIG. 8 is a block diagram illustrating a representation of an example of an electronic system to which the semiconductor devices and the semiconductor systems illustrated in FIGS. 1 to 7 may be applied.

The data storage 1001 may store data applied from the memory controller 1002, read the stored data, and output the read data to the memory controller 1002, according to a control signal from the memory controller 1002. The data storage 1001 may include the second semiconductor device 12 illustrated in FIG. 1. The data storage 1001 may include a nonvolatile memory which can continuously store data stored therein even though power supply is cut off. The nonvolatile memory may include flash memory (Nor Flash Memory, NAND Flash Memory), PRAM (Phase Change Random Access Memory), RRAM (Resistive Random Access Memory), STTRAM (Spin Transfer Torque Random Access Memory), and MRAM (Magnetic Random Access Memory).

The memory controller 1002 may decode a command applied from an external device (host device) through the input/output interface 1004, and control the data input/output for the data storage 1001 and the buffer memory 1003 according to the decoding result. The memory controller 1002 may include the first semiconductor device 11 illustrated in FIG. 1. Referring to FIG. 8, the memory controller 1002 is represented by one block. However, the memory controller 1002 may separately include a controller for controlling the nonvolatile memory 1001 and a controller for controlling the buffer memory 1003 which is a volatile memory.

The buffer memory 1003 may temporarily store data to be processed by the memory controller 1002, that is, data inputted to or outputted from the data storage 1001. The buffer memory 1003 may store the data DATA applied form the memory controller 1002 according to a control signal. The buffer memory 1003 may read the stored data and output the read data to the memory controller 1002. The buffer memory 1003 may include a volatile memory such as DRAM (Dynamic Random Access Memory), mobile DRAM or SRAM (Static Random Access Memory).

The input/output interface 1004 may provide a physical connection between the memory controller 1002 and an external device (host), receive a control signal for controlling the memory controller 1002 to input or output data to or from the external device, and exchange data with the external device. The input/output interface 1004 may include one of various interface protocols such as USB, MMC, PCI-E, SAS, SATA, PATA, SCSI, ESDI, and IDE.

The electronic system 1000 may be used as a secondary memory device or external storage device of the host device. The electronic system 1000 may include an SSD (Solid State Disk), a USB (Universal Serial Bus) memory, an SD (Secure Digital) card, a mSD (mini Secure Digital) card, a micro SD card, an SDHC (Secure Digital High Capacity) card, a memory stick card, an SM (Smart Media) card, a MMC (Multi Media Card), an eMMC (Embedded MMC), and a CF (Compact Flash) card.

In accordance with the present embodiments, the semiconductor device may delay the point of time that the input/output line and the complementary input/output line are sensed and amplified during a test read operation, and output the output data signal, thereby testing a bridge which is formed between the input/output line and the complementary input/output line according to whether the output data signal is normal.

Although preferred embodiments have been disclosed for illustrative purposes, those skilled in the art will appreciate that various modifications, additions and substitutions are possible, without departing from the scope and spirit of the disclosure as defined in the accompanying claims.

What is claimed is:

1. A semiconductor device comprising:
    a data output control circuit configured to generate a sense amplification control signal by delaying a column select signal by a first delay section based on a control code signal; and
    a data output circuit configured to sense and amplify data of an input/output line and a complementary input/output line based on the sense amplification control signal, and output the amplified data as an output data signal,
    wherein the column select signal is enabled to transfer data loaded in a bit line and a complementary bit line to the input/output line and the complementary input/output line.

2. The semiconductor device of claim 1, wherein the first delay section is set by the control code signal.

3. The semiconductor device of claim 1, wherein the first delay section is set to have a greater delay time than a delay time in which data are loaded in the input/output line and the complementary input/output line and the levels of the input/output line and the complementary input/output line are equalized by a bridge.

4. The semiconductor device of claim 1, wherein the data output control circuit generates the sense amplification control signal by delaying the column select signal by the first delay section based on enablement of a test signal, and generates the sense amplification control signal by delaying the column select signal by a second delay section based on disablement of the test signal.

5. The semiconductor device of claim 4, wherein the first delay section is set to have a greater delay time than the second delay section.

6. The semiconductor device of claim 1, wherein the data output circuit generates the sense amplification control signal by delaying the column select signal by the first delay section during a first test read operation, and generates the sense amplification control signal by delaying the column select signal by a second delay section during a second test read operation.

7. The semiconductor device of claim 6, wherein the first test read operation and the second test read operation are sequentially performed.

8. The semiconductor device of claim 6, wherein the second delay section is set to have a greater delay time than the first delay section.

9. The semiconductor device of claim 1, wherein the data output control circuit generates a precharge control signal which is enabled in synchronization with a point of time that the sense amplification control signal is generated.

10. The semiconductor device of claim 9, wherein the data output circuit precharges the input/output line and the complementary input/output line to a preset level based on the precharge control signal.

11. The semiconductor device of claim 1, wherein the data output control circuit comprises:
    a sense amplification control circuit configured to generate the sense amplification control signal by delaying the column select signal by the first delay section based on a test signal and the control code signal; and
    a precharge control circuit configured to generate a precharge control signal from a read pulse signal and the sense amplification control signal based on the test signal.

12. The semiconductor device of claim 11, wherein the sense amplification control circuit comprises:
    a first delay circuit configured to generate a first delayed signal by delaying the column select signal by a second delay section;
    a second delay circuit configured to generate a second delayed signal by delaying the column select signal by the first delay section based on the control code signal; and
    a first selection circuit configured to select one of the first and second delayed signals based on the test signal and output the selected signal as the sense amplification control signal.

13. The semiconductor device of claim 11, wherein the precharge control circuit comprises:
    a section setting circuit configured to generate a first section signal which is disabled during a preset section, based on the read pulse signal;
    a latch circuit configured to generate a second section signal which is disabled based on the read pulse signal, and enabled based on the sense amplification control signal; and
    a second selection circuit configured to select one of the first and second section signals based on the test signal, and output the selected signal as the precharge control signal.

14. A semiconductor system comprising:
    a first semiconductor device configured to output a command signal and a control code signal, and receive an output data signal; and
    a second semiconductor device configured to generate a sense amplification control signal by delaying a column select signal by a first delay section based on the command signal and the control code signal, the column select signal being generated based on performing a test read operation, sense and amplify a signal of an input/output line and a complementary input/output line based on the sense amplification control signal, and output the amplified signal as the output data signal,
    wherein the column select signal is enabled to transfer data loaded in a bit line and a complementary bit line to the input/output line and the complementary input/output line.

15. The semiconductor system of claim 14, wherein the first delay section is set by the control code signal.

16. The semiconductor system of claim 14, wherein the first delay section is set to have a greater delay time than a delay time in which data are loaded in the input/output line and the complementary input/output line and the levels of the input/output line and the complementary input/output line are equalized to each other by a bridge.

17. The semiconductor system of claim 14, wherein the second semiconductor device generates the sense amplification control signal by delaying the column select signal by the first delay section based on the command signal, and generates the sense amplification signal by delaying the column select signal by a second delay section based on the command signal.

18. The semiconductor system of claim 17, wherein the first delay section is set to have a greater delay time than the second delay section.

19. The semiconductor system of claim 14, wherein the second semiconductor device generates the sense amplification control signal by delaying the column select signal by the first delay section during a first test read operation, and generates the sense amplification control signal by delaying the column select signal by a second delay section during a second test read operation.

20. The semiconductor system of claim 19, wherein the first and second test operations are sequentially performed, and the second delay section is set to have a delay time greater than the first delay section.

* * * * *